(12) United States Patent
Chuang et al.

(10) Patent No.: US 9,966,230 B1
(45) Date of Patent: May 8, 2018

(54) MULTI-COLUMN ELECTRON BEAM LITHOGRAPHY INCLUDING FIELD EMITTERS ON A SILICON SUBSTRATE WITH BORON LAYER

(71) Applicant: KLA-Tencor Corporation, Milpitas, CA (US)

(72) Inventors: Yung-Ho Chuang, Cupertino, CA (US); Yinying Xiao-Li, San Jose, CA (US); Xuefeng Liu, San Jose, CA (US); John Fielden, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days. days.

(21) Appl. No.: 15/605,308

(22) Filed: May 25, 2017

Related U.S. Application Data

(60) Provisional application No. 62/407,664, filed on Oct. 13, 2016.

(51) Int. Cl.
*H01J 37/317* (2006.01)
*H01J 37/20* (2006.01)
*H01J 37/244* (2006.01)
*H01J 37/10* (2006.01)
*H01J 37/147* (2006.01)
(Continued)

(52) U.S. Cl.
CPC ........ *H01J 37/3177* (2013.01); *H01J 37/045* (2013.01); *H01J 37/073* (2013.01); *H01J 37/10* (2013.01); *H01J 37/147* (2013.01); *H01J 37/20* (2013.01); *H01J 37/244* (2013.01); *H01J 2237/0435* (2013.01)

(58) Field of Classification Search
USPC .................................. 250/310, 423 F, 492.2
See application file for complete search history.

(56) References Cited

U.S. PATENT DOCUMENTS

| | | | |
|---|---|---|---|
| 3,755,704 A | 8/1973 | Spindt et al. | |
| 5,363,021 A | 11/1994 | MacDonald | |
| | | (Continued) | |

FOREIGN PATENT DOCUMENTS

JP 2005310724 A 11/2005

OTHER PUBLICATIONS

Spindt, A Thin-Film Field-Emission Cathode, Journal of Applied Physics, vol. 39, No. 7, pp. 3504-3505 Jun. 1, 1968.
(Continued)

*Primary Examiner* — Kiet T Nguyen
(74) *Attorney, Agent, or Firm* — Hodgson Russ LLP

(57) ABSTRACT

A multi-column electron beam device includes an electron source comprising multiple field emitters fabricated on a surface of a silicon substrate. To prevent oxidation of the silicon, a thin, contiguous boron layer is disposed directly on the output surface of the field emitters. The field emitters can take various shapes including a pyramid, a cone, or a rounded whisker. Optional gate layers may be placed on the output surface near the field emitters. The field emitter may be p-type or n-type doped. Circuits may be incorporated into the wafer to control the emission current. A light source may be configured to illuminate the electron source and control the emission current. The multi-column electron beam device may be a multi-column electron beam lithography system configured to write a pattern on a sample.

20 Claims, 10 Drawing Sheets

(51) Int. Cl.
*H01J 37/04* (2006.01)
*H01J 37/073* (2006.01)

(56) References Cited

U.S. PATENT DOCUMENTS

| | | | | |
|---|---|---|---|---|
| 6,140,646 | A | * 10/2000 | Busta | G01J 5/20 250/332 |
| 2009/0315444 | A1 | 12/2009 | Chen et al. | |
| 2009/0325329 | A1 | * 12/2009 | Kuribayashi | H01J 9/26 438/20 |
| 2010/0258724 | A1 | 10/2010 | Hayashibara et al. | |
| 2011/0204224 | A1 | 8/2011 | Yamada et al. | |
| 2014/0246397 | A1 | 9/2014 | Sugiyama et al. | |
| 2016/0343532 | A1 | 11/2016 | Chuang et al. | |
| 2017/0047207 | A1 | 2/2017 | Chuang et al. | |

OTHER PUBLICATIONS

Fowler, et al., Electron Emission in Intense Electric Fields, Proceedings of the Royal Society of London A, vol. 119, No. 781, pp. 173-181 Mar. 31, 1928.

Kyritsakis, et al., Derivation of a generalized Fowler-Fordheim equation for nanoscopic field-emitters, Proceedings of the Royal Society of London A, vol. 471, No. 2174, pp. 1-10 Jan. 7, 2015.

Utsumi, Vacuum Microelectronics: What's New and Exciting, IEEE Transactions on Electron Devices, vol. 38, No. 10, pp. 2276-2283 Oct. 1, 1991.

Sarubbi, et al., Chemical Vapor Deposition of a-Boron Layers on Silicon for Controlled Nanometer-Deep p+n Junction Formation, Journal of Electronic Materials, vol. 39, No. 2, pp. 162-173 Dec. 11, 2009.

Shaw, et al., Silicon Field Emitter Arrays, Vacuum Microelectronics, edited by Wei Zhu, pp. 187-246 Jan. 1, 2001.

Slot, et al., Mapper: High Throughput Maskless Lithography, Proc. of SPIE, vol. 6921, p. 69211P, 9 pages Mar. 1, 2008.

Groves, et al., Maskless electron beam lithography: prospects, progress, and challenges, Microelectronic Engineering, vol. 61, No. 1, pp. 285-293 Jul. 1, 2002.

Parker, et al., High-throughput NGL electron beam direct-write lithography system, Proc. of SPIE, vol. 3997, pp. 713-720 Jul. 1, 2000.

Petric, et al., REBL Nanowriter: Reflective Electron Beam Lithography, Proc. of SPIE, vol. 7271, p. 727107, 15 pages Mar. 1, 2009.

Freed, et al., Reflective electron-beam lithography performance for the 10 nm logic node, Proc. of SPIE, vol. 8622, p. 85221J, 9 pages Dec. 1, 2012.

ISA/KR, International Search Report for PCT/US2017/056400 dated Jan. 29, 2018.

* cited by examiner

MULTI-COLUMN ELECTRON BEAM LITHOGRAPHY INCLUDING FIELD EMITTERS ON A SILICON SUBSTRATE WITH BORON LAYER

CROSS-REFERENCE TO RELATED APPLICATIONS

This application claims priority to the provisional patent application filed Oct. 13, 2016 and assigned U.S. App. No. 62/407,664, the disclosure of which is hereby incorporated by reference.

FIELD OF THE DISCLOSURE

This disclosure relates to electron beam lithography systems.

BACKGROUND OF THE DISCLOSURE

A lithographic process includes the patterned exposure of a resist so that portions of the resist can be selectively removed to expose underlying areas for selective processing such as by etching, material deposition, implantation, and the like. Traditional lithographic processes utilize electromagnetic energy in the form of ultraviolet light for selective exposure of the resist. As process nodes continue to shrink, optical lithography (or photolithography) has become increasingly inadequate because of its diffraction limit. Wavelength reduction, mask and illumination optimization, numerical aperture increase, and proximity correction can only improve resolution to a certain extent. The semiconductor industry is seeking alternatives to optical lithography. Charged particle beams have been used for high resolution lithographic resist exposure. In particular, electron beams have been used because the low mass of electrons allows relatively accurate control of an electron beam at relatively low power. Electron beam lithographic systems may be categorized as electron beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be easily varied. Furthermore, high resolutions can be attained by electron beam writing, since electron foci with small diameters may be attained with electron-optical imaging systems. However, the process is time-consuming due to the sequential, point-wise writing. Therefore, EBDW is typically used for the production of the masks required in projection lithography. Even for patterning photomasks, which generally have dimensions 4× those of the wafer, electron beam lithography takes multiple hours to write an entire mask.

In electron beam projection lithography, analogous to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. However, in a conventional electron beam projection lithography system, a corresponding mask is necessary for each structure to be exposed. The preparation of customer-specific circuits in small numbers is not economic, because of the high costs associated with mask production.

Based on the above discussion, EBDW lithography may be a better candidate for low-cost electron beam lithography than electron beam projection lithography. EBDW does not use masks (i.e., is maskless), eliminating the mask costs and speeding up the semiconductor manufacturing process. EBDW lithography also has the potential to achieve improved resolution. Nevertheless, EBDW has a problem relating to its low throughput. For example, it may take about ten to one hundred hours to write a pattern over an entire wafer using EBDW lithography. One previous approach to attempt to increase the throughput is by increasing the beam current. However, when the current density exceeds a certain threshold, electron-electron interactions (e.g., repulsive Coulomb forces between electrons) cause the beam to blur and the spot size to increase. This limitation further limits throughput for existing electron beam lithography systems.

One solution to reduce electron-electron interactions is to spread the current over the photomask, the reticle, or the wafer using multiple electron beams that write simultaneously. Multi-beam writing improves the throughput of EBDW lithography by using a plurality of electron beams writing in parallel on the substrate instead of one single electron beam. This massive parallelism can circumvent the physical limitations of electron beam lithography systems, and can make EBDW appealing to cost and extendibility. Nonetheless, there are several challenges for multi-beam lithography. One of the challenges is to simultaneously control multiple electron beams in terms of individual beam placement, footprint, dose, and blur. It is even more challenging to achieve a compact multiple beam design by using the existing commercially available, bulky electron sources, such as thermionic emitters, which are usually made of tungsten or lanthanum hexaboride ($LaB_6$), or Schottky emitters, which are typically made of a tungsten wire having a tip coated with a layer of zirconium oxide ($ZrO_x$).

Electron beam lithography systems need an electron source to generate an electron beam directed towards a sample. Electron sources can be divided into two broad groups: thermionic sources and field emission sources. Thermionic sources are the most common commercially available electron emitters, and are usually made of tungsten or lanthanum hexaboride ($LaB_6$). In thermionic emission, electrons are boiled off the material surface when the electron thermal energy is high enough to overcome the surface potential barrier. Even though thermionic emitters are widely in use, they typically require elevated temperatures (>1300 K) to operate, and may have several drawbacks such as inefficient power consumption, wide energy spread, short lifetime, low current density, and limited brightness. The demand for more efficient electron sources has driven the research and development of Schottky emitters and cold electron sources such as electron field emitters.

In the Schottky emitters, thermionic emission is enhanced by effective potential barrier lowering due to the image charge effect under an applied external electric field. Schottky emitters are typically made of a tungsten wire having a tip coated with a layer of zirconium oxide ($ZrO_x$), which exhibits a much lower work function (~2.9 eV). Schottky emitters are currently used in some electron beam systems. Despite being quite successful, thermally-assisted Schottky emitters still need to be operated at high temperature (>1000 K) and high vacuum (~$10^{-9}$ mbar), and have wider than desirable electron emission energy spread due to the high operating temperature. An electron source with lower energy spread, higher brightness (e.g., radiance) and higher current density than Schottky emitters may be desirable for semiconductor wafer and mask inspection, review, and lithography as it will enable faster and, hence, more cost effective, inspection, review, and lithography.

Cold electron sources, particularly electron field emitters are known in the art. Such emitters have been used in field emission displays, gas ionizers, x-ray sources, electron beam lithography, and electron microscopes, among other applications.

Field emission takes place when the applied electric field is high enough to reduce the potential barrier on the tip-vacuum interface so that electrons can tunnel through this barrier at a temperature close to room temperature (e.g., quantum-mechanical tunneling). A typical field-emitter comprises a conical emitter tip with a circular gate aperture. A potential difference is established across the emitter cathode, the gate and the anode under an applied external field, resulting in high electric field at the surface of the tip. Electrons tunnel through the narrow surface barrier and travel towards an anode, which is biased at a higher potential than the gate. The emission current density can be estimated by a modified version of the Fowler-Nordheim theory, which takes into account the field enhancement factor due to the field emitters.

Field emitters, because they can operate near room temperature, have lower energy spread than Schottky and thermionic emitters, and can have higher brightness and electron current than thermionic emitters. However, in practical use, the output current of a field emitter is less stable as contaminants can easily stick to the tip of the emitter and raise its work function, and hence lower the brightness and current. Periodic flashing (i.e., temporarily raising the tip temperature) is required to remove those contaminants. While the tip is being flashed, the instrument is not available for operation. In the semiconductor industry instruments are required to operate continuously and stably without interruption, so Schottky emitters are usually used in preference to cold field emitters.

Previous field emitter arrays (FEAs) had multiple conically shaped electron emitters arranged in a two-dimensional periodic array. These field emitter arrays can be broadly categorized by the material used for fabrication into two broad categories: metallic field emitters and semiconductor field emitters.

Early efforts have been concentrated on developing metallic field emitters. For example, Spindt-type molybdenum field emitters were developed because molybdenum has a low resistivity (53.4 nΩ·m at 20° C.) and a high melting point (2896 K). Nevertheless, metallic emitters suffer from several disadvantages such as lack of uniformity due to metal deposition techniques, and more severely the degradation in emission current, mainly due to oxidation.

With the advent of modern semiconductor fabrication technology, there has been investigation of semiconductor field emitters, particularly silicon field emitters.

Single-crystal (monocrystalline) silicon is an attractive material for field emitters. Silicon crystals can be grown with very high purity and very few crystal defects. The conductivity of silicon can be altered by doping and/or applying a voltage. More importantly, silicon has a well-developed technology base. The mature silicon integrated circuit (IC) technology makes it possible to fabricate arrays of silicon field emitters.

The structure of a typical prior-art silicon field emitter is shown in FIG. 8. A silicon substrate 61 is doped with impurities and can be either n-type or p-type doped. The cone-shaped emitter 64 is formed on the silicon substrate 61, with an optional gate layer 67 attached to a dielectric layer 66, which includes one or more insulating layers. The optional gate layer 67 controls and extracts the emission current. A third electrode, such as the anode (not shown), faces the gate layer 67 and is separated at a large distance (e.g., on the order of hundreds of microns) from the cathode. This is the typical silicon field emitter triode configuration. Note that without the gate layer 67, the field emitter can be used as a diode. Quantum tunneling of electrons takes place when a bias voltage is applied across the structure of the emitter 64. A large electrical field is generated on the surface of the tip of the emitter 64, and electrons are emitted from the tip.

Silicon field emitters are not yet commercially available. One serious problem with the use of silicon to form field emitters is that silicon is quite reactive, and can be contaminated within hours, even at pressures around $10^{-10}$ torr. Silicon very readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombination is high. Furthermore, the band gap of silicon dioxide is large (about 9 eV) creating an additional barrier higher than the work function that an electron has to overcome in order to escape, even if the oxide is very thin. For example, native oxide on a very smooth silicon surface is typically about 2 nm thick. In some circumstances, oxidation can also change the shape of the field emitters. These aforementioned problems may result in low brightness and current, unstable emission, low reliability, poor scalability and poor uniformity, which have hindered the commercial use of silicon field emitters.

Research effort has been expanded in looking for surface treatments and coatings for field emitters to improve their performance for lower turn-on voltages, higher emission current densities, lower noise, and improved stability. These treatments may include coating the emitter tips with refractory metals, silicides, carbides, and diamond. However, these coating materials are usually limited by the fabrication process in forming smooth and uniform coating surfaces, and/or are often affected by the oxide layer formed on the coating surfaces, creating an additional energy barrier. For these reasons, coated silicon field emitters have not become yet practical as cold electron sources.

Therefore, what is needed is an electron source that overcomes some, or all, of the limitations of the prior art. In addition, there is a need for a multiple electron beam lithography system with improved throughput that overcomes some, or all, of the deficiencies of previous systems.

BRIEF SUMMARY OF THE DISCLOSURE

An electron beam lithography system is provided. The electron beam lithography system comprises a plurality of columns; an electron source; a stage configured to hold a sample; an immersion lens for each of the columns that is configured to focus an electron beam on the sample; and a backscattered electron detector configured to detect backscattered electrons from a surface of the sample. The electron beam lithography system is configured to write a pattern on the sample with the at least two electron beams. Each of the columns has electron optics. The electron optics are configured to de-magnify and focus an electron beam onto the sample. The electron source is configured to generate at least two of the electron beams that are directed toward the sample. The electron source includes a silicon substrate having a top surface, at least two field emitters formed directly on the top surface of the silicon substrate, and a boron layer disposed on each field emitter. Each field emitter comprises a pyramid, a rounded cone, or a rounded whisker. Each of the field emitters on the silicon substrate is aligned with one of the columns whereby the field emitters are each configured to emit one of the primary electron beams into one of the columns. The boron layer is greater than 90% boron.

Two of the field emitters can be spaced apart on the silicon substrate from 10 μm to 500 μm.

In an instance, at least four of the field emitters are formed directly on the top surface of the silicon substrate. The at least four of the field emitters are disposed on the top surface of the silicon substrate in a regular grid pattern.

The electron source in each of the columns can further include a plurality of extraction and focusing electrodes configured to extract and focus the primary electron beam in the column; a plurality of apertures; and alignment deflectors.

The electron optics in each of the columns can further includes a rotator; accelerating column plates configured to increase energy of the primary electron beam in the column; and mainfield and subfield deflectors.

Each of the columns can further comprise a blanking system that includes a blanking electrode and a blanking aperture.

The electron beam may be configured to have an energy from 1 keV to 5 keV.

Each of the two field emitters can be configured in a diode or triode configuration.

The field emitters can be connected to a driving circuit and two emission-control MOSFETs in series. The two emission-control MOSFETs can include a data input line and a scan line.

The at least two field emitters can be p-type doped with a doping level less than about $10^{19}$ cm$^{-3}$. In an instance, the at least two field emitters are configured to operate in a reverse bias mode in which a depletion layer is generated by an electric field at the emitter surface.

The at least two field emitters can be p-type doped with a doping level less than about $10^{14}$ cm$^{-3}$. In an instance, the at least two field emitters are configured to operate in a reverse bias mode in which a depletion layer is generated by an electric field at the emitter surface. In another instance, the electron source further comprises light sources configured to illuminate the at least two field emitters and to control the emission currents from the at least two field emitters.

The at least two field emitters can be n-type doped with a doping level greater than about $10^{16}$ cm$^{-3}$.

The boron layer can have a thickness in the range of approximately 2 nm to 6 nm.

The electron source can further comprise a dielectric layer disposed on the top surface of the silicon adjacent to the field emitter, and a conductive gate disposed on top of the dielectric layer. A thickness of the dielectric layer may be approximately equal to or less than a height of the field emitter.

The electron source can further comprise field-effect transistors (FETs) configured to control the emission current. In an instance, the electron source further comprises a second dielectric layer disposed on the top surface of a conductive gate, and a focusing electrode disposed on top of the second dielectric layer.

Tips of the at least two field emitters each can have a lateral dimension greater than 10 nm and less than 100 nm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1A:
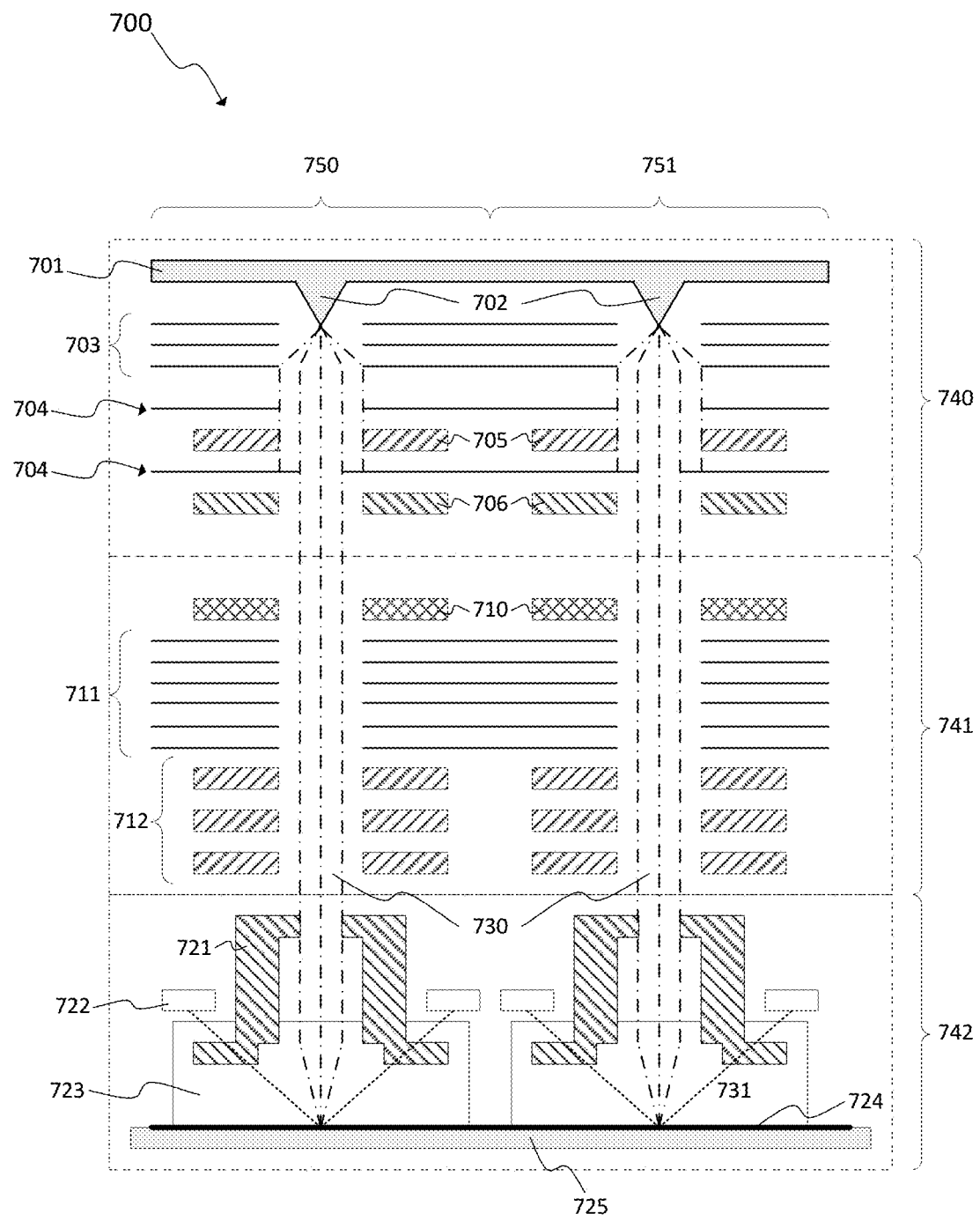
FIG. 1(A) illustrates an exemplary multiple column electron beam lithography system incorporating the present disclosed electron source and electron optics in accordance with an embodiment of the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims. The following description is presented to enable one of ordinary skill in the art to make and use the disclosure as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference.

This disclosure relates to electron field emitters suitable for use in lithography systems, including those used to pattern photomasks, reticles, and semiconductor wafers, and to high throughput electron beam lithography systems using the disclosed electron field emitters.

An embodiment of the present disclosure is directed to a multiple column electron beam lithography system with improved throughput using an electron field emitter array as the electron source. The multi-column design includes separate miniaturized columns, which can avoid electron-electron interactions between the electron beams. Multiple electron beams are formed by an array of closely spaced miniature electron-optical columns. Preferably, the electron beams are operated at relatively low energies such as energies between about 1 keV and about 5 keV, though the columns are capable of operating at higher energies, such as energies up to about 50 keV. Each column may contain a single field emitter and a beam-forming, blanking, and/or deflection system, including extraction, focusing, and/or deflector gates, to produce a focused beam to perform the exposure. The columns can be fabricated using standard semiconductor fabrication techniques and microelectromechanical systems (MEMS) technologies. Rather than using commercially available, bulky electron sources such as tungsten, LaB$_6$, and Schottky emitters, the field emitter array makes it possible to achieve a compact multiple electron beam design. Furthermore, each cathode of the field emitter array is capable of generating a higher beam current than the aforementioned commercially available sources even at low electron energies, such as energies less than 5 keV. Also, by operating at relatively low energy (such as below 5 keV, or, preferably, below about 2 keV), proximity and resist heating issues can be eliminated. In one embodiment, field-effect transistors (FETs) are utilized to simultaneously and individually control the field emitters. The multi-column electron beam lithography system improves the throughput of EBDW lithography by using multiple electron beams writing in parallel on the sample. This massive parallelism can overcome the physical limitations of electron beam lithography systems, and can offer a favorable cost benefit and extendibility to future process nodes.

One embodiment of the present disclosure is directed to an electron source, in a diode configuration, including a field emitter cathode, and an anode facing the cathode. The field emitter is formed on a silicon substrate and a substantially pure boron (first) layer is formed on at least the output surface of the field emitter. The silicon substrate is preferably essentially defect-free monocrystalline (single-crystal) silicon having a thickness in the range of about 10 nm to about 100 μm. The boron layer is preferably formed using a high temperature deposition process (e.g., between about 600° C. and 800° C.) on clean silicon in a manner that produces a pin-hole free, contiguous, and substantially pure boron layer having a thickness from 2 nm to 6 nm (preferably about 2 nm to 5 nm) over at least emission regions of the output surface. The boron layer circumvents silicon's oxidation problem by hermetically sealing at least the emission regions of the silicon surface against oxidation. The field emitter can be fabricated by standard complementary metal-oxide-semiconductor (CMOS) fabrication techniques. Silicon dioxide or silicon nitride can be used as mask material and deposited by plasma-enhanced chemical vapor deposition (PECVD), and photolithography can be used for patterning. Dry etching (such as reactive ion etching (RIE), inductively coupled plasma (ICP), or electron cyclotron resonance (ECR)), wet etching, or a combination of the two can be used to form the field emitter, which can take various shapes, such as rounded whiskers (cylindrical posts with round tips), rounded cones, or pyramids. The tip of the field emitter may have a lateral dimension between about 1 nm and 100 nm or between about 10 nm and 100 nm. The field emitter circumvents silicon's relatively high work function by taking advantage of the field enhancement due to the field emitter. A second electrode (e.g., the anode) is positioned facing the field emitter cathode. The anode may comprise a metal such as tungsten, molybdenum, or stainless steel. To prevent breakdown, the anode may be separated from the cathode by a relatively large distance, on the order of hundreds of microns. A high voltage source, typically in the order of kilovolts, may be utilized to generate an external potential difference between the cathode and the anode in order to cause electrons to preferentially move towards the emitter tip. Since field emission depends on the electric field near the tip of a field emitter, lower voltages may be used if the tip to anode distance is smaller. For example, lower voltages may be used with distances less than 50 μm.

Field emission takes place when the applied electric field is high enough to reduce the potential barrier on the silicon-vacuum interface so that electrons can tunnel through this barrier (e.g., quantum-mechanical tunneling). In a semiconductor, where the electron concentration is determined by the local doping level and potential, it is possible to configure the field emitters to be operated in reverse bias mode like in a p-n diode, in which a depletion layer is generated due to the high electric field at the emitter surface. The interface between vacuum and a boron-coated, p-type doped field emitter can form a p-n junction, in which the vacuum is considered to be an n-type medium. In this case, the conduction and valence bands will bend down at the surface. If the electric field is sufficient to bring the bottom of the conduction band below the Fermi energy level, there will be an abundance of electrons at the apex of the emitter tip, and an emission current, on the order of nA to μA, can be produced. The emission current density can be estimated by a modified version of the Fowler-Nordheim theory, which takes into account the field enhancement factor due to the field emitter. In an alternate embodiment, the concentration of the p-type dopant may be less than about $10^{14}$ cm$^{-3}$. The silicon in or near the field emitter may be illuminated by a light source to create and control the emission current by modulating the light intensity. In yet another alternate embodiment, the silicon may be n-type doped.

Thus, by producing an electron emitter structure having both a boron layer and a field emitter formed on the single-crystal silicon substrate, the present disclosure provides the beneficial qualities of silicon (e.g., high purity/low defect material, long electron recombination times, and mature silicon-based fabrication process), and enables the enticing features of field emitters (e.g., small emitter size, low power consumption, high brightness, high current density, high speed, and long emitter lifetime), while avoiding the negative aspects that have previously prevented the widespread commercial use of silicon-based field emitter structures.

According to various alternate embodiments of the present disclosure, various additional layers and structures may be utilized to further enhance the beneficial qualities of the field emitter structure. In one embodiment, a gate layer or control electrode is placed close to, or slightly lower than, the height of the field emitter tip in order to further enhance the electric field at the emitter tip, and achieve fast and accurate control of the emission current. The gate layer is formed on top of one or several insulating layers deposited on the substrate. In another embodiment, additional gate layers are placed on top of the first, each higher than the height of the field emitter, and each separated from one another by insulating layers. In yet other embodiments, multi electron beam sources comprise a plurality of field emitters arranged in a two-dimensional periodic pattern (field-emitter array or FEA) disposed on the emitter surface for emitting electrons in the presence of an electric field.

Additional details of the field emitter are described in U.S. Publication No. 2017/0047207, the disclosure of which is hereby incorporated by reference.

FIG. 1(A) illustrates an exemplary multiple column electron beam lithography system incorporating the present disclosed electron source and electron optics to write a pattern on a sample 724, which may be a semiconductor wafer, reticle, or photomask. Lithography system 700 may comprise field emission tips 702, source substrate 701, gate and focusing electrodes 703, apertures 704, alignment deflectors 705, blanking electrodes 706, rotator 710, accelerating column plates 711, mainfield and subfield deflectors 712, blanking aperture or lens plate 721, backscattered electron (BSE) detector 722, immersion lens 723, sample 724, and stage 725. The functionality of each of these electron optical components will be described below.

The exemplary lithography system 700 is depicted in FIG. 1(A) with two columns 750 and 751 for the purposes of explaining important aspects of the disclosure without making the figure overly complicated. A practical implementation of a lithography system in accordance with this disclosure will typically include more than two columns. Each column of the lithography system 700 typically includes an electron source, electron optics, and a detector. As depicted in FIG. 1(A), each column comprises three sections. First, an electron source 740, which includes field emission tip 702, extraction and focusing electrodes 703, apertures 704, alignment deflectors 705, and blanking electrodes 706. Second, an accelerating and scanning region 741, which includes a rotator 710, accelerating plates 711, and mainfield and subfield deflectors 712. Third, an immersion lens region 742, which includes blanking aperture or lens plate 721, immersion lens 723, and BSE detector 722. Each of the columns 750, 751 focuses and directs a primary electron beam 730 from a field emission tip 702 to the sample 724. The electron source 740 can incorporate a boron-coated silicon field emitter as disclosed herein, in a diode, triode, or other configuration. Electrons are emitted from field emitter cathode 702, travel through extraction and focusing electrodes 703 (which may include an anode), apertures 704, alignment deflectors 705, and blanking electrodes 706 to form an electron beam 730 with a desired beam energy and beam current, usually in the order of nA to µA. Electron source 740 may further comprise a magnetic lens (not shown). The accelerating plates 711 and scanning deflectors 712 increase the energy of the electron beam 730 and scan the electron beam 730 on the sample 724. This region 741 can also be used to correct for mechanical and stage errors, and to perform fine focusing adjustments of the electron beam 730. Immersion lens 723 and lens plate or blanking aperture 721 provide the primary focusing for the electron beam 730 onto the sample 724. BSE detector 722 detects backscattered electrons 731 (shown with dotted lines) that are emitted from the exposed surface. BSE detector 722 may include a single BSE detector 722 per column or multiple BSE detectors 722 per column. Two BSE detectors 722 are illustrated per column 750, 751 in FIG. 1(A). In an embodiment, BSE detector 722 comprises a boron-coated silicon detector, because such detectors have high quantum efficiency for detecting electrons. BSE detector 722 is used for alignment mark detection and alignment of the electron beam 730 to the sample 724. The sample 724 is placed on a stage 725 in order to facilitate movement of different regions of sample 724 with respect to the columns 750, 751. Multiple columns can be included in a lithography system. For example, there may be between four and twenty columns included in a lithography system. More than twenty columns also may be included in a lithography system.

The field emission tips 702 can be fabricated on a single substrate 701. Alignment between the field emission tips 702 and the columns 750, 751 is simplified. The columns 750 and 751 may be spaced apart by multiple cm, whereas the field emission tips 702 can be closer together. The alignment tolerance between the columns 750, 751 and the field emission tips 702 may be in the range of a few hundred nanometers or smaller.

Alignment between the substrate 701 and/or field emission tips 702 and the columns 750, 751 may be based on the corners of the substrate or by specific alignment marks placed on the substrate during the fabrication process. Conventional lithography techniques can ensure that the emitter tips 702 are well-defined and aligned.

The substrate 701 may include more field emission tips 702 than there are columns 750, 751. Should one of the field emission tips 702 degrade or become non-functional, then the substrate 701 can be shifted within the lithography system 700 so that new, functional field emission tips 702 are used. See, for example, the description below of FIG. 1(B) for more details on this aspect of the emitter.

The multiple columns, such as the two columns 750 and 751 depicted in FIG. 1(A), operate to expose multiple areas of the sample 724 simultaneously, thus reducing the time required to write a pattern on a large area of the sample 724 compared with a single column. The disclosed multi-column electron beam lithography system 700 has several advantages over previous multi-column and multi-beam electron beam lithography systems. Since the field emission tips 702 are fabricated on a single substrate 701 by lithographic and other standard semiconductor manufacturing techniques, their spacing can be accurately controlled and their shapes, coating thicknesses, and other dimensions and properties can be similar from one tip to another, thus simplifying tip replacement and alignment. Formation of the field emission tips 702 on a single substrate 701 also can enable simplified swapping of the substrate 701 when the field emission tips 702 are replaced. Compared with a multi-beam electron lithography system that generates multiple beams from a single electron source, using a separate electron source for each beam allows more current per beam, and hence a shorter time to write a given pattern on sample 724. The boron coating on the emission regions of the field emitter ensures higher brightness emission (emission current per unit area per unit solid angle) and more stable emission current than conventional electron sources or than silicon field emitters without boron coating. As explained below, including in the descriptions of FIGS. 2(A) and 2(B), one aspect of the emitters disclosed herein is that the emission currents can be controlled by electrical signals, either by direct electrical connection or through modulating a light intensity that in turn controls the emission current. This control of the emission current allows control of the exposure dose from each column of the multi-column electron beam lithography system 700 as the pattern is written on sample 724.

The electron optical elements and other components depicted in FIG. 1(A) are merely illustrative of components of a lithography system incorporating the electron sources disclosed herein. Additional electron optical elements and components may be included and/or some of those depicted in FIG. 1(A) may be omitted. For example, more or fewer apertures may be placed in the path of each beam. These apertures may help define the final size of the electron spot on the sample, limit the transmission of scattered electrons or ions, and/or allow differential pumping so that a high vacuum level (i.e., lower pressure) may be maintained close to the field emitters 702. In another example, accelerating plates 711 may comprise more or fewer electrodes than depicted in FIG. 1(A). In yet another example, the deflection may comprise other combinations of magnetic and/or electrostatic deflectors than those depicted in FIG. 1(A).

Lithography system 700 may also include optical sensors for monitoring, for example, the location and/or speed of stage 725, and/or for detecting pre-existing patterns on sample 724. The information from these sensors may be used, for example, to ensure that the patterns written on sample 724 by lithography system 700 are accurately aligned to pre-existing patterns.

Figure 1B:
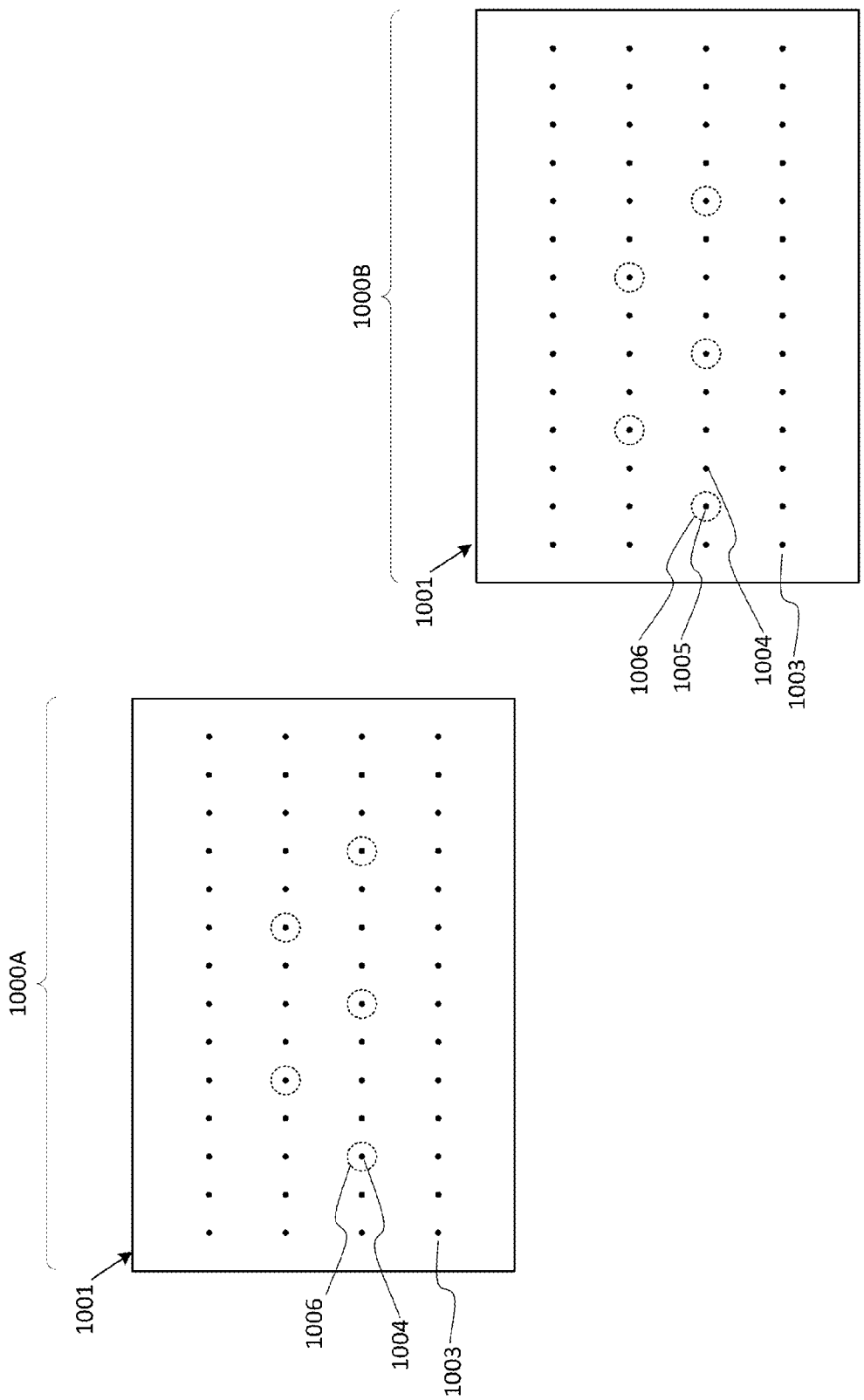
FIG. 1(B) illustrates an exemplary layout of multiple emitters and multiple columns.

FIG. 1(B) illustrates, in view from above a lithography system, an exemplary layout of an array of emitters and multiple columns. 1000A shows, at one time during operation, the relative alignment of substrate 1001 comprising an array of emitters, whose locations are indicated by dots such as the one labeled 1003, with the multiple columns, the locations of which are indicated by the dotted circles such as the one labeled 1006. In FIG. 1(B), the emitters are shown as arranged in a rectangular grid pattern on substrate 1001. The emitters can have a regular grid pattern. Thus, the emitters can be equally spaced in a first direction and equally spaced in a second, perpendicular direction. In an alternative embodiment, the emitters may be arranged in any regular pattern, including, but not limited to, a square array or a hexagonal array. In 1000A, the emitter 1004 is aligned with the center (axis) of column 1006. In this figure, four other emitters are aligned with four other columns (not labeled). Five columns are shown in FIG. 1(B) to illustrate the principle. In a practical lithography system, the number of columns may be fewer or greater than five, such as ten, twenty, or more. The columns are arranged in a regular grid pattern with spacings that are integer multiples of the spacings of the emitters on the substrate 1001. In FIG. 1(B), the horizontal spacing of the columns is depicted as four times the horizontal spacing of the emitters, and the vertical spacing of the columns is depicted as equal to that of the emitters. These ratios are merely exemplary and are not intended to be limiting. In a preferred embodiment the spacing between emitters would be between a few tens of microns and a few hundred microns, whereas the spacing between columns might be between a few mm and a few cm. Hence there may be many tens or hundreds of emitters between each column in both directions. Since the emitters are fabricated on substrate 1001 using standard semiconductor manufacturing processes including lithography, the separations between the emitters can be precisely controlled within 100 nm or 200 nm or less, depending on the processes used. During manufacturing of the lithography system, the columns can be aligned to the desired spacing. The substrate 1001 may be installed and adjusted in position so that emitters align with each column much faster than individual emitters could be mechanically aligned with individual columns. Since each column, as described above, contains electron optics, small alignment differences between an individual column and an emitter (such as alignment differences of a few microns or a few tens of microns) can be compensated for by adjusting the electrical signals to that column's electron optics by, for example, adjusting signals to a deflector.

After operating for some time, such as for hours, days, or weeks, the emission current from one, or more, emitters may decrease due to, for example, changes in the work-function of the emitter tip or damage to the emitter tip. When at least one column no longer has sufficient electron beam current to maintain the writing speed of the lithography system, substrate 1001 may be moved to a new position such as that illustrated at 1000B in FIG. 1(B). 1000B shows substrate 1001 shifted to the right by a distance equal to the horizontal separation of two emitter tips. In the position shown at 1000B, emitter 1004 is no longer aligned with any column and can be turned off. Instead emitter 1005 is aligned with column 1006. Fresh emitters are simultaneously aligned with the other columns by that single shift. It is the accurate relative alignment of the emitters on substrate 1001 that enables a single shift to change all the operating emitters at one time. This is much faster than changing and realigning each emitter individually, and maximizes the time that the lithography system is operating and available for writing patterns. Substrate 1001 may include alignment features (not shown) with known positions relative to the array of emitters. Such alignment features can be fabricated by standard semiconductor manufacturing processes at the same time as the emitters are fabricated.

Figure 2A:
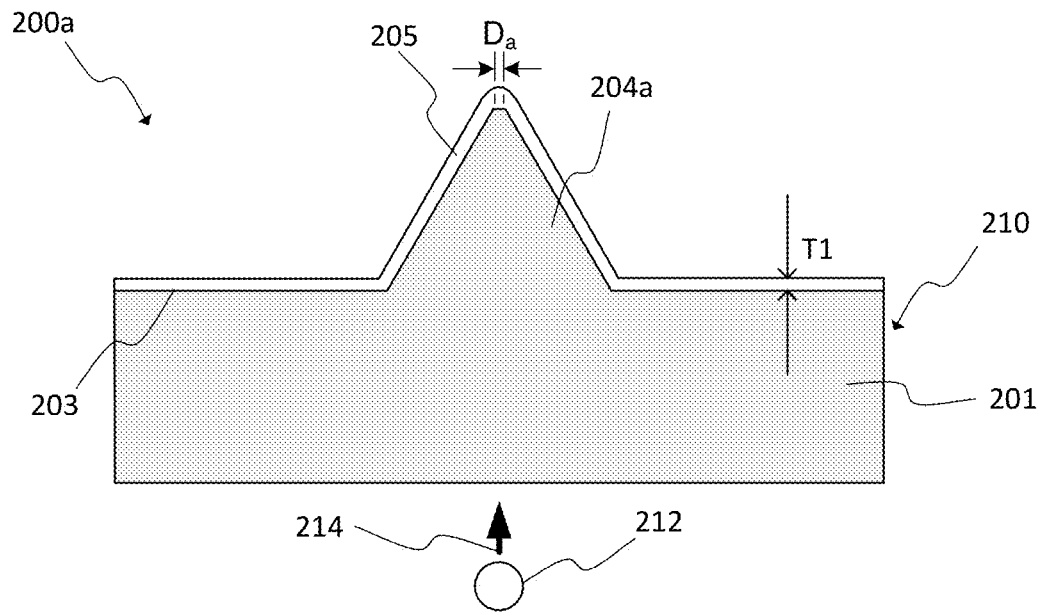
FIGS. 2(A) and 2(B) are cross-sectional side views illustrating electron sources in a diode configuration including a boron-coated silicon field emitter formed on a silicon substrate according to an exemplary embodiments of the present disclosure.

FIG. 2(A) illustrates, in cross section view, an electron source 200a according to an exemplary embodiment of the present disclosure. Electron source 200 generally includes a field emitter cathode 210 and an anode (not shown) facing the cathode 210. The anode may be separated by a distance between about one micron and a few hundred microns from the cathode 210. In the field emitter cathode 210, a silicon substrate 201 having an upward-facing output (top) surface 203, with a field emitter 204a disposed on output surface 203, and a substantially pure, contiguous boron layer 205 disposed on the output surface 203, covering the field emitter 204a. The field emitter 204a shown in this figure has a pyramidal shape that can be made by anisotropic etching, which may have a slope angle close to 54.7° since that angle corresponds to the intersection of the (100) and (111) planes in monocrystalline silicon. Oxidation sharpening, which may be performed at a low to moderate temperature (e.g., less than about 950° C.), may be used prior to depositing boron layer 205 when sharp field emitter tips are desired. The apex of the sharpened tip may comprise, at atomic scale lengths, a substantially flat area, such as a surface substantially parallel to a crystal plane of the silicon crystal, such as substantially parallel to a (100) plane. In FIG. 2(A) a characteristic lateral dimension, such as a diameter, of the sharpened region is indicated by $D_a$. In a preferred embodiment $D_a$ may be between about 1 nm and about 100 nm, or between about 10 nm and about 100 nm. A second electrode, such as the anode (not shown), is positioned facing the field emitter cathode 210. The anode may comprise a metal such as tungsten, molybdenum, or stainless steel. A voltage source is utilized to generate an external potential difference between the cathode and the anode in order to cause electrons to preferentially move towards the tip of field emitter 204a. Electron source 200a operates similarly to a typical cold electron source in that, when a strong electric field (such as a field between about 100 V $\mu m^{-1}$ and about 10 kV $\mu m^{-1}$) is applied to the tip, electrons have a high probability of being emitted from substrate 201 through the output surface 203 of the field emitter, most often from near the tip of the field emitter 204a. Boron layer 205 on the tip hermetically seals the tip against oxidation. To ensure that the boron layer 205 provides a good hermetic seal without forming a strong barrier to electron emission, the thickness T1 of the boron layer 205 may be between about 2 nm and 6 nm. Even if a few percent of oxygen remains at the interface between silicon and boron, no more oxygen can penetrate and no significant further oxidation occurs. Since the electron emission occurs from a small region near the apex of the emitter, such as the area with a lateral dimension $D_a$ shown in FIG. 2(A), the quality of the boron layer 205 in this region may be most important. A few pinholes or gaps in the coverage of the boron layer 205 more than a few hundred nm away from this emission region will typically not affect the emission and can be tolerated.

The phrase substantially pure boron layer implies that the majority of the layer is elemental boron. Some impurities, such as silicon or carbon may be present either on the surface or in the lattice. For example, a boron silicide may be present at the interface between the boron layer 205 and the substrate 201. Oxygen may be present in the bulk of the layer, but not in an easily detectable amount. Thus, the layer can comprise, consist of, or consist essentially of boron. The boron layer 205 may be greater than 75%, greater than 80%, greater than 85%, greater than 90%, greater than 95%, greater than 96%, greater than 97%, greater than 98%, or greater than 99% boron.

The phrase contiguous boron layer implies that the boron layer 205 is unbroken across part of the output surface 203. The output surface may be just the surface of the field emitter 204 or may be a larger area on the output surface 203 that at least includes the field emitter 204a. The majority of the electron emission from field emitter 204a may be from a region of tens of nm in radius in an instance, and this radius may be covered by the boron layer 205 in an unbroken manner.

The boron layer 205 may be, for example, 5 nm thick or may be 20 to 25 atomic layers of boron. The boron layer 205 may have a uniform thickness or may deposit differently on the field emitter 204a versus the rest of the output surface 203.

According to an aspect of the present disclosure, silicon substrate 201 can comprise monocrystalline silicon (i.e., a single crystal of silicon) that is p-type doped with a doping level less than about $10^{19}$ cm$^{-3}$, i.e. a resistivity of about 0.005 Ω·cm or higher. Since minority carrier lifetime and diffusion length decrease with increasing dopant concentration, dopant concentrations higher than about $10^{19}$ cm$^{-3}$ may be used when the silicon is very thin, such as thinner than about 1 µm, whereas when the silicon is thicker than about 1 µm, dopant concentrations lower than about $10^{19}$ cm$^{-3}$ may be preferred. For silicon that is thicker than a few microns, such as a thickness of 10 µm or more, lower dopant concentrations, such as less than about $10^{14}$ cm$^{-3}$, may be preferred to ensure long carrier lifetime and low dark current. Since electrons are a minority carrier in p-type doped silicon, one embodiment using p-type silicon includes an optional light source 212 to shine light 214 onto the field emitter to create electron-hole pairs within the silicon. Light source 212 may be a high-intensity light source such as a laser diode or a high brightness LED, such as one having a bandwidth of about 20 nm or less. Light source 212 may be placed behind the emitter 204a opposite the front side with the emitter 204a to illuminate a back side as shown, or may illuminate the emitter 204a from the front side opposite this back side. When the light source 212 is placed below the emitter 204a as shown, light source 212 can emit a light wavelength that penetrates relatively deep into the silicon, such as a wavelength longer than about 500 nm, in order to create electron-hole pairs away from the bottom surface of the silicon. When light source 212 illuminates the field emitter 204a from the top side, a shorter wavelength that penetrates more shallowly into silicon, such as a wavelength shorter than about 450 nm, may be used to create electron-hole pairs relatively close to the field emitter 204.

In an alternate embodiment, the silicon may be n-type doped with a dopant concentration of about $10^{16}$ cm$^{-3}$ or greater. Silicon with n-type doping has many electrons available in the conduction band, which may be drawn toward the tip of the field emitter 204a to form the emission current. When using n-type doped silicon, the emission current may be controlled by adjusting a voltage on a gate electrode (such as an electrode within the extraction and focusing electrodes, or gate 307 in FIG. 3) or by adjusting the voltage difference between the anode and the field emitter. When n-type doped silicon is used, the optional light source 212 may be omitted.

Figure 2B:
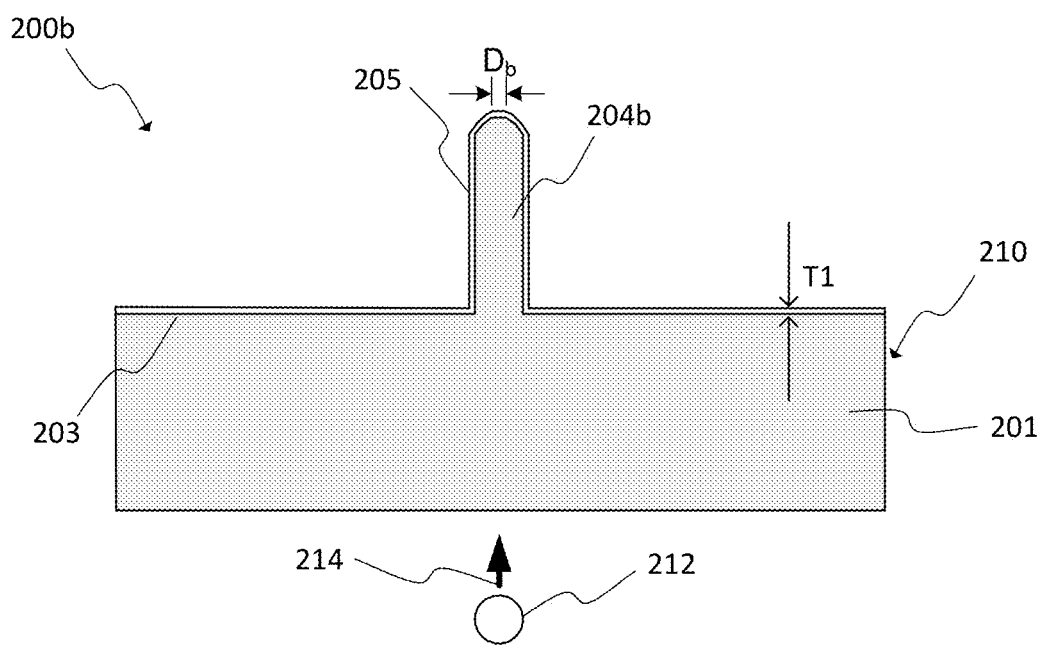

According to another aspect of the present disclosure, the field emitter 204a may take various geometrical forms such as rounded whiskers, rounded cones, or pyramids. FIG. 2(B) illustrates an electron source 200b comprising a rounded whisker emitter 204b. Rounded whiskers, or rounded cones with zero-degree half angle, provide a higher field enhancement in comparison with rounded cones or pyramid, with a half angle greater than zero degrees. However, rounded whiskers are typically worse heat conductors than rounded cones or pyramids. Thus, there is usually a trade-off between field enhancement and thermal stability. Field emitter 204b may extend from a surface of the substrate 201 by less than 10 µm or by less than 20 µm. Other than the shape of the field emitter structure, electron source 200b may be similarly configured as the various embodiments of electron source 200a described above. Corresponding features that may be similarly configured are labeled with the same labels as in FIG. 2(A) and will not be described in detail again to avoid unnecessary repetition. The apex of rounded whisker 204b may comprise, at atomic scale lengths, a substantially flat area, such as a surface substantially parallel to a crystal plane of the silicon crystal, for example substantially parallel to a (100) plane. In FIG. 2(B) a characteristic lateral dimension, such as a diameter, of the sharpened region is indicated by $D_b$. In a preferred embodiment $D_b$ may be between about 1 nm and about 100 nm. Similar to electron source 200a, electron source 200b may comprise p-type or n-type doped silicon and may include an optional light source 212.

According to another aspect of the present disclosure, the field emitter 204a or 204b can be fabricated by standard CMOS fabrication techniques. Silicon dioxide or silicon nitride can be used as a mask material and deposited by, for example, PECVD, and photolithography can be used for patterning. Dry etching (such as RIE, ICP, or ECR), wet etching, or a combination of the two can be used to form the field emitter. Oxidation sharpening, which is usually performed at low to moderate temperature (e.g. less than about 950° C.), may be used prior to depositing boron layer 205 when sharp field emitter tips are desired.

According to another aspect of the present disclosure, the field emitter is configured to operate in reverse bias mode as in a p-n diode, in which a depletion layer is generated due to the high electric field at the emitter surface. The interface between vacuum and a boron-coated, p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emitter tip, and an electric current, in the order of nA to µA, is produced. Field emission takes place when the applied electric field is high enough to reduce the potential barrier on the silicon-vacuum interface so that the electron can tunnel through this barrier (quantum-mechanical tunneling). The emission current density can be estimated by a modified version of the Fowler-Nordheim theory, which takes into account the field enhancement factor due to the field emitter.

According to another aspect of the present disclosure, boron layer 205 comprises essentially pure boron that is disposed directly on the output surface of the field emitter. As used herein, the phrase "directly on" in conjunction with the boron-to-silicon interface is intended to mean that there are no continuous intervening layers (e.g., oxide or SiNT) layers) separating output surface 204a or 204b of the field emitter and boron layer 205 other than a possible thin layer (e.g., a few monolayers) of $SiB_x$ that may form at the Si/B interface. Note also that the phrase "directly on" does not preclude the presence of oxide between some portions of the boron and silicon. Boron layer is grown on clean smooth silicon at a high temperature (e.g., at a temperature greater than approximately 500° C., such as between about 600° C. and 800° C.) using techniques taught by F. Sarubbi et al. "Chemical Vapor Deposition of a-Boron Layers on Silicon for Controlled Nanometer-Deep $p^+n$ Junction Formation," Journal of Electronic Materials, Vol. 39, No. 2, (February 2010) pp. 162-173, which is incorporated by reference in its entirety. The boron can form a pin-hole free coating having a thickness T1 in the range of approximately 2 nm to 6 nm, preferably approximately 2 to 4 nm, including all ranges and values to the 0.1 nm between. Other sections of the coating may include pin-hole defects outside of the coating on the field emitter 204 or the coating may be entirely pin-hole free. In an instance, the presence of pin-hole defects is minimized outside of the field emitter 204.

It may be important to remove all native oxide from the silicon by, for example, a wet clean followed by an in-situ thermal hydrogen clean prior to depositing the boron. Lower temperature deposition of boron is also possible, though the coating may be less uniform, and a coating thicker than 2 nm may be needed to ensure that the coating is pin-hole free. An advantage of the boron layer is that such a pin-hole free coating, when applied to a clean silicon surface, prevents formation of a native oxide on the output surface of the field emitter. As previously described, a silicon dioxide layer has a high band gap and even thin layers can block a significant fraction of electrons from leaving the silicon. Thus, the boron layer 205 allows even electrons with low energies to leave the silicon field emitter 204a or 204b. Formed on the silicon substrate 201, the field emitter 204a or 204b circumvents limitations of prior-art electron emitters and the sharp emitter provides field enhancement and more emission current. In addition, prior art silicon devices could not avoid a silicon dioxide interface layer from forming between the silicon and the low work-function material, even if the silicon layer was free of oxide when coated. That is, without an impervious pin-hole-free protection layer on the silicon, oxygen would eventually migrate to the silicon surface and form an oxide layer. An advantage of forming layer 205 using boron is that even a thin pin-hole-free boron layer is impervious to oxygen and hermetically seals the silicon. Since most of the electron emission occurs from a small region near the apex of the field emitter, the lack of pin-holes may only be needed within a few hundred nm of the apex of the field emitter. The boron coating well away from the tip, such as on the sides of field emitter 204 or 204b, may be of lower quality than the boron coating at the tip. Another advantage of the boron coating is that the density of defects and interface traps at the silicon to boron interface is typically lower than at the silicon to silicon dioxide interface leading to higher emission current.

Figure 3:
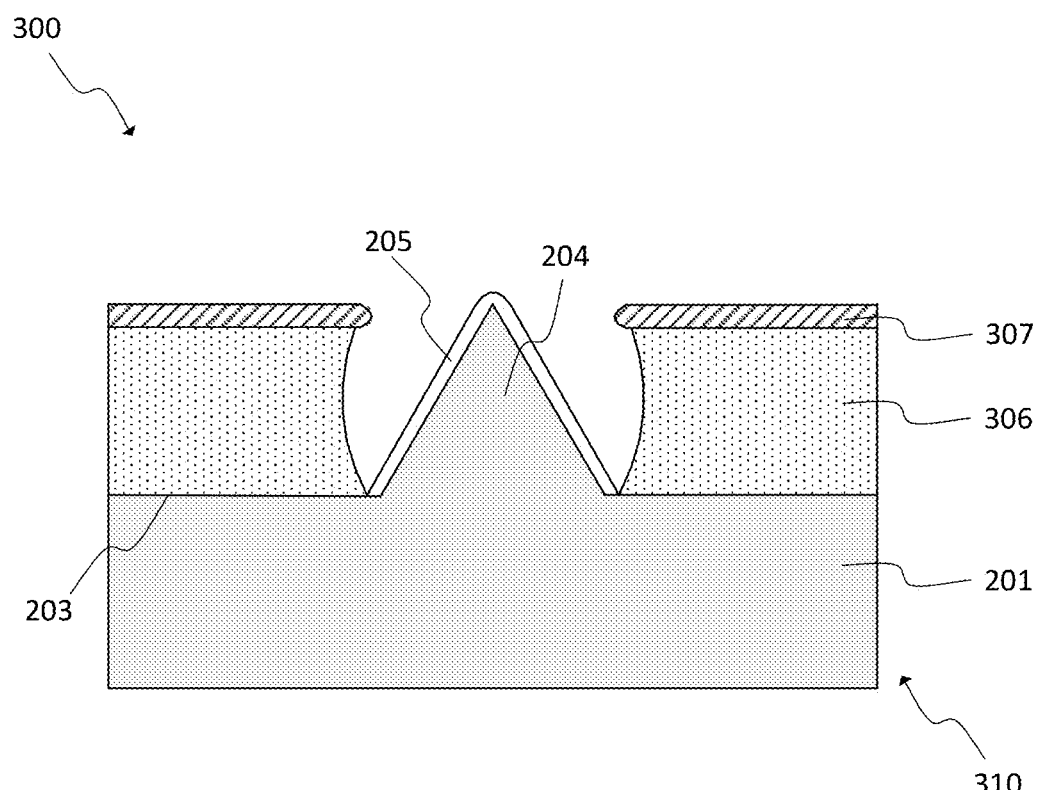
FIG. 3 is a cross-sectional side view illustrating an electron source in a triode configuration including a boron-coated silicon field emitter formed on a silicon substrate and a gate layer according to an alternate embodiment of the present disclosure.

FIG. 3 illustrates, in cross section view, an electron source 300 according to a first alternate embodiment. Similar to the structure described above, electron source 300 includes a field emitter cathode 310, and an anode (not shown) facing the cathode 310 and separated at a large distance, in the order of hundreds of microns, from the cathode 310. In the field emitter cathode 310, a silicon substrate 201 having an upward-facing output (top) surface 203, with a field emitter 204 (similar to 204a or 204b depicted in FIGS. 2(A) and 2(B)) disposed on output surface 203, and a substantially pure boron layer 205 disposed on the output surface 203, covering the field emitter 204. A second electrode, such as the anode (not shown), is positioned facing the field emitter cathode 310. The anode may be made of a metal such as tungsten, molybdenum, or stainless steel. A voltage source is utilized to generate an external potential difference between the cathode and the anode in order to cause electrons to preferentially move towards the emitter tip. Electron source 300 differs from the previously described embodiment in that it includes a gate 307 or control electrode, close to or slightly lower than the height of the field emitter tip and attached to the field emitter by a dielectric layer 306, in order to achieve fast and accurate control of the emission current. Thus, the dielectric layer 306 is approximately equal to or less than the height of the field emitter. Preferably the thickness of dielectric layer 306 differs from the height of the field emitter by no more than about 1 µm. Dielectric layer 306 may comprise one or more dielectric materials, such as $SiO_2$ or $Si_3N_4$. The dielectric layer 306 is disposed on the top surface of the silicon surrounding the field emitter, but does not necessarily cover the field emitter 204. In another instance, the dielectric layer 306 partly covers the field emitter 204. The gate layer can be fabricated by standard CMOS fabrication techniques using physical vapor deposition (PVD), chemical vapor deposition (CVD), or atomic layer deposition (ALD) deposition methods. The gate 307 may comprise a metal or polysilicon. One of the simplest emitter designs is a triode configuration in which only one gate layer is used. This gate layer is typically formed on top of a dielectric, comprising one or several insulating layers, deposited on substrate 201. Two or more gate layers (not shown) may be utilized in more complex emitter designs, where multiple dielectric layers are used as spacers in between these gate layers. Note that electron source 300 is not limited to pyramidal or conical field emitters and may comprise any shape field emitter, such as the rounded whisker shaped field emitter 204b illustrated in FIG. 2(B) or another shape. Changes or other configurations from those in FIG. 2(A) are possible in the embodiment of FIG. 3.

While the boron layer 205 is illustrated as only covering the field emitter 204, the boron layer 205 also can extend under the dielectric layer 306. For example, the boron layer 205 may be formed on the substrate 201 and field emitter 204 before formation of the dielectric layer 306.

Figure 4A:
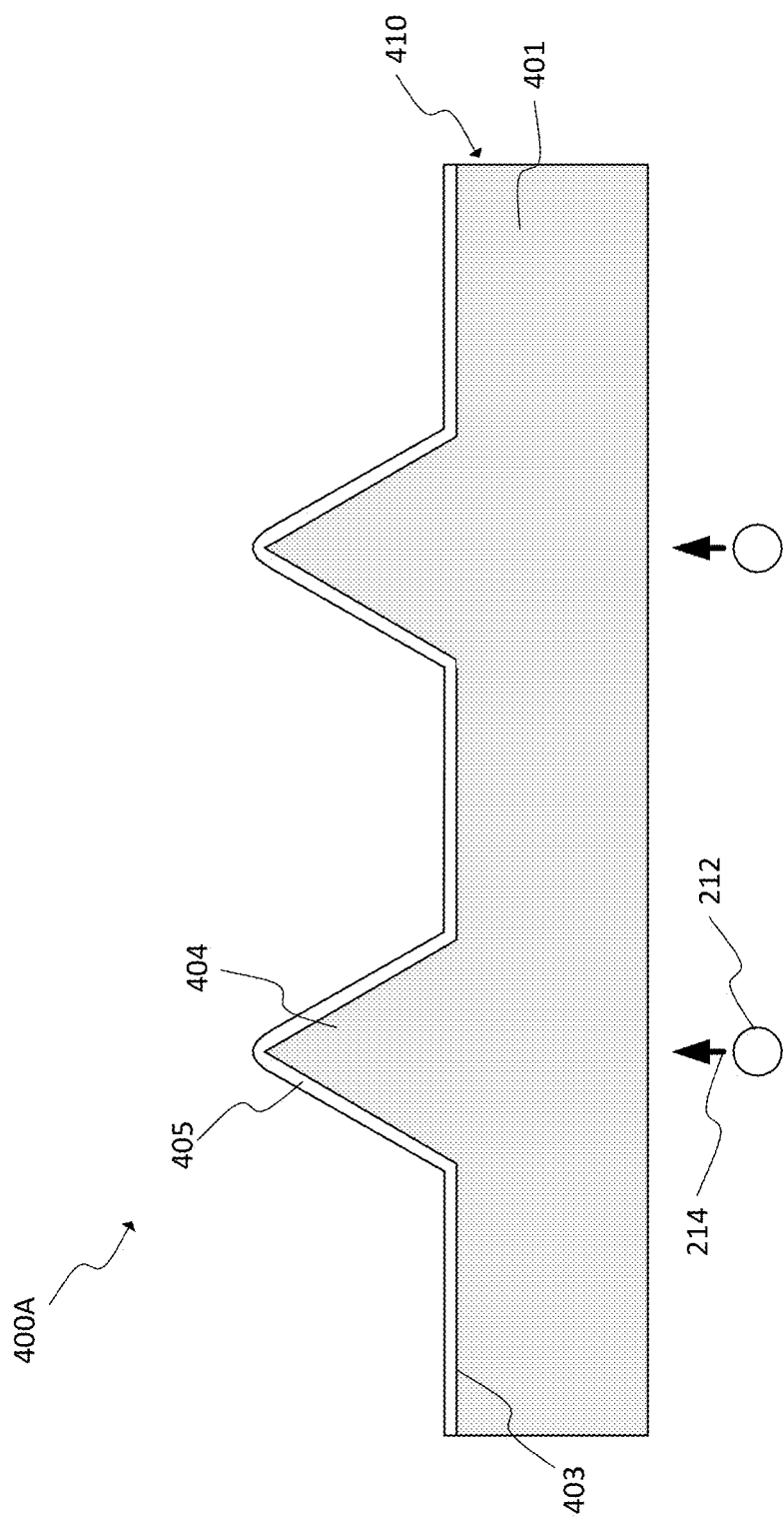
FIGS. 4(A) and 4(B) are cross-sectional side view diagrams illustrating multi electron beam sources including a boron-coated silicon field emitter array formed on a silicon substrate, in the diode and triode configurations, according to alternate embodiments of the present disclosure.
Figure 4B:
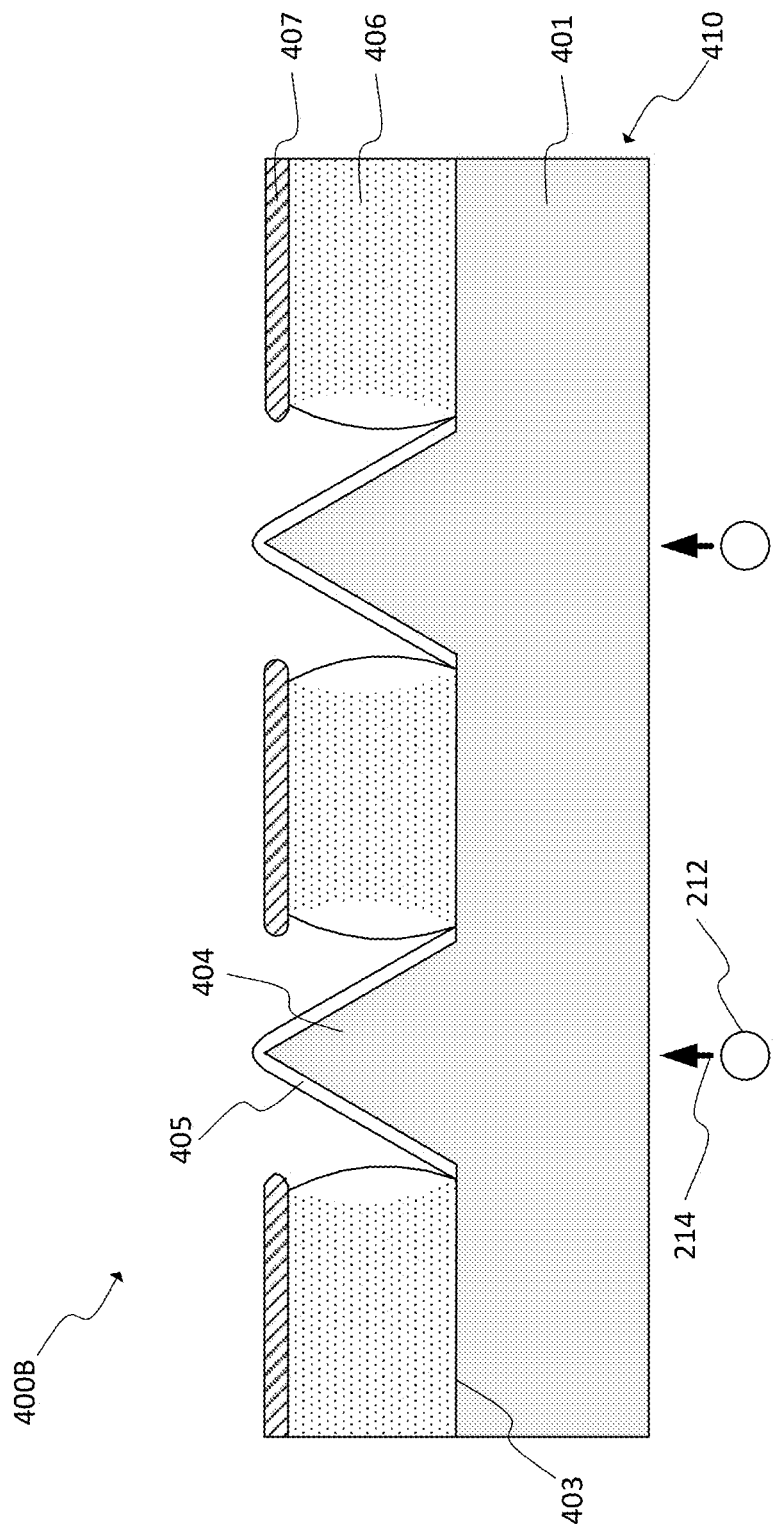

FIGS. 4(A) and 4(B) illustrate, in cross section view, disclosed electron sources according to other alternate embodiments of the present disclosure in which additional layers and structures are utilized to further enhance the beneficial qualities of the disclosed electron source structure. The illustrated exemplary embodiments are not intended to be exhaustive, and electron sources including combinations of the additional layers and structures described below are understood to be possible. The embodiments of FIGS. 4(A) and 4(B) may be similar to the embodiments of FIG. 2(A), 2(B), or 3 in an array. Thus, the boron layer 405 may be similar to the boron layer 205. Note that electron sources 400A and 400B are not limited to pyramidal or conical field emitters may comprise any shape field emitter, such as the rounded whisker shaped field emitter 204b illustrated in FIG. 2(B) or another shape. Changes or other configurations from those in FIG. 2(A), 2(B), or 3 are possible in the embodiments of FIG. 4(A) or 4(B).

FIG. 4(A) illustrates, in cross section view, an electron source 400A according to an alternate embodiment. Electron source 400A includes an FEA cathode 410, with an anode (not shown) facing the FEA cathode 410. An FEA typically comprises a plurality of conical, pyramidal, or rounded whisker electron emitters arranged in a two-dimensional periodic array. Any shape of the silicon field emitter that can be used as a single emitter can be replicated as an array.

In the FEA cathode 400A, a silicon substrate 401 having an upward-facing output (top) surface 403, with a plurality of field emitters arranged in a two-dimensional periodic pattern, such as the FEA 404 disposed on output surface 403. A substantially pure boron layer 405 is disposed on the output surface 403, covering the FEA 404. The field emitters 404 shown in this figure have a pyramidal shape that can be made by anisotropic etching, preferably with a slope angle close to 54.7° since that angle corresponds to the intersection of the (100) and (111) planes in monocrystalline silicon. Oxidation sharpening, which may be performed at a low to moderate temperature (e.g., less than about 950° C.), may be used prior to depositing pure boron layer 405 when sharp field emitter tips are desired. A second electrode, such as the anode (not shown), is positioned facing the field emitter cathode 410. The anode may be made of a metal such as tungsten, molybdenum, or stainless steel. A voltage source is utilized to generate an external potential difference between the FEA cathode and the anode in order to cause electrons to preferentially move towards the emitter tips. Electron source 400A operates similarly to a typical cold electron source in that, when positioned properly, electrons 412 have a high probability of being emitted from substrate 401 through the output surface 403 of the FEA 404, most often from near the tips of the field emitters.

In a manner similar to the field emitters 204a and 204b as described above, the plurality of field emitters 404 can be fabricated by standard CMOS fabrication techniques. Silicon dioxide or silicon nitride can be used as a mask material and deposited by, for example, PECVD, and photolithography can be used for patterning. Dry etching (such as RIE, ICP or ECR), wet etching, or a combination of wet etching and dry etching can be used to form the field emitters. Oxidation sharpening, which may be performed at a low to moderate temperature (such as temperature less than about 950° C.), may be used prior to depositing pure boron layer 405 when sharp field emitter tips are desired. For example, see J. Shaw, and J. Itoh, "Silicon Field Emitter Arrays," in *Vacuum Microelectronics*, W. Zhu, ed. (Wiley, 2001), pp. 187-246, which is incorporated by reference herein in its entirety.

A parameter influencing the field emitter properties is the spacing between the field emitters. It is known that closely-spaced emitters reduce the field enhancement factor due to screening effects resulting in insufficient electric field penetration between the individual emitters. Thus, to minimize field-shielding effects and to optimize field emission current density, the distance between vertically aligned emitters, or the emitter spacing, can be substantially large, on the order of tens of microns to a few centimeters. In an instance, the field emitters are spaced from 100 μm to 10 cm apart, including all ranges and values to the 1 μm between. For example, the field emitters may be spaced 10 μm, 50 μm, 100 μm, 200 μm, or 500 μm apart. The spacing of the emitters may be at least three times the height of an emitter. Generally, the spacing of the emitters matches the electron optics of the system that they are incorporated into. For that reason, a spacing from 100 μm to several cm may be chosen. However, the spacing also may be from 50 μm to 200 μm so that there can be spare emitters between the columns.

FIG. 4(B) illustrates, in cross section view, an electron source 400B according to another alternate embodiment. Similarly to the structure described above, electron source 400B includes a FEA cathode 410, with an anode (not shown) facing the FEA cathode 410. In electron source 400B, each individual emitter may be similar to emitter 300 described above and may be similarly configured. In the FEA, electron source 400B comprises a silicon substrate 401 having an upward-facing output (top) surface 403 with a plurality of field emitters arranged in a two-dimensional periodic pattern (e.g., the FEA 404 disposed on output surface 403) and a substantially pure boron layer 405 disposed on the output surface 403 covering the FEA 404. A second electrode, such as the anode (not shown), is positioned facing the field emitter cathode 410. The anode may comprise a metal such as tungsten, molybdenum, or stainless steel. A voltage source is utilized to generate an external potential difference between the FEA cathode 410 and the anode in order to cause electrons to preferentially move towards the emitter tips. Electron source 400B differs from the previously described embodiment of FIG. 4(A) in that it includes a gate 407, or control electrode, close to or slightly lower than the height of the field emitter tips and attached to the field emitters by a dielectric 406, in order to achieve fast and accurate control of the emission current. The dielectric layer 406 is disposed on the top surface of the silicon surrounding the field emitters, but does not necessarily cover the field emitters. In another instance, the dielectric layer 406 partly covers one or more of the field emitters. The gate layer can be fabricated by standard CMOS fabrication techniques using PVD, CVD, or ALD deposition methods. The gate 407 may comprise a metal or polysilicon. The simplest emitter design is the triode configuration in which only one gate layer is used, but other configurations are possible. The gate 407 is typically formed on top of an insulating layer (dielectric 406), which is usually an oxide layer, deposited on the substrate. Two or more gate layers are utilized in more complex emitter designs (not shown), where insulating layers form spacers in between these gate layers.

Figure 5:
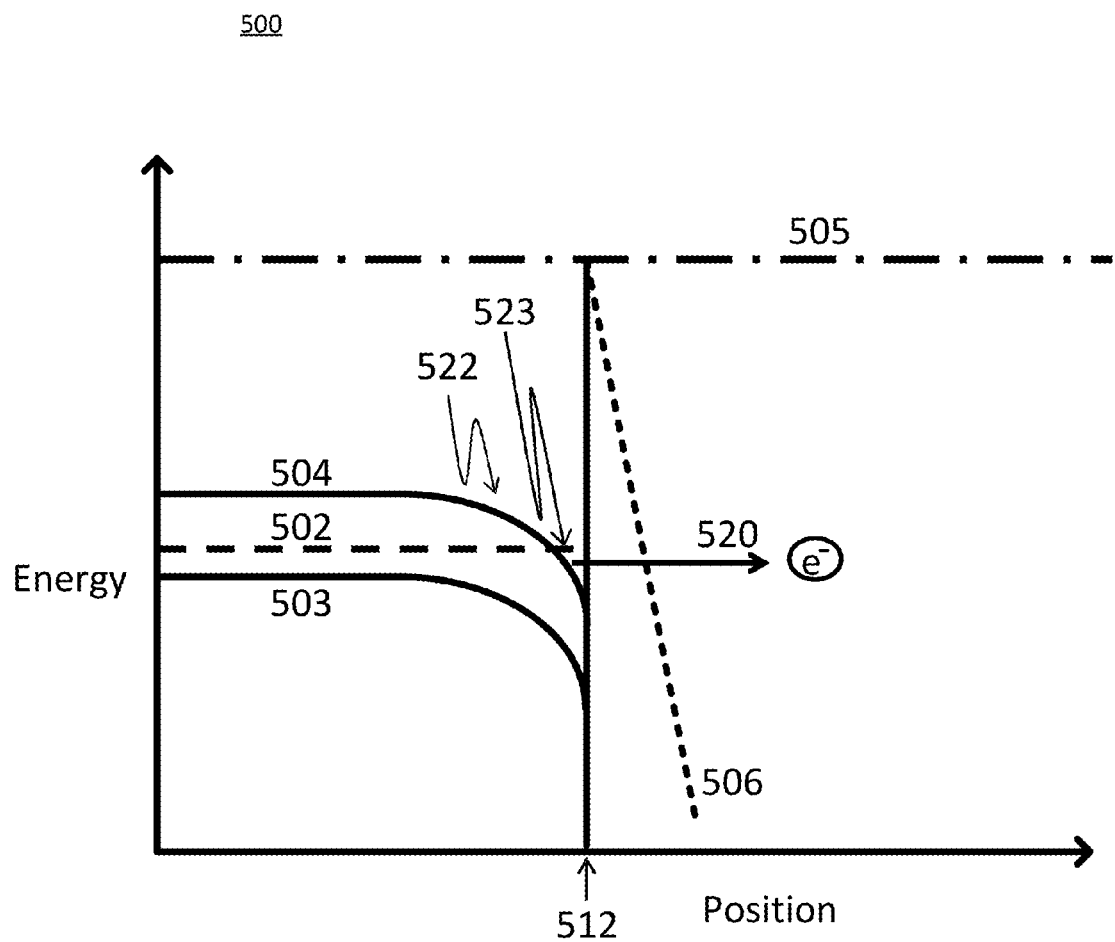
FIG. 5 is an energy diagram illustrating exemplary electron energy levels inside the silicon substrate of an electron source formed in accordance with the present disclosure.

FIG. 5 is an exemplary energy diagram illustrating electron field emission of an exemplary disclosed electron source structure formed in accordance with the embodiments described herein. The vertical direction represents energy. The horizontal direction represents position relative to a field emitter tip surface. The field emitter tip surface position is indicated by label 512. Locations within the emitter cathode are shown to the left of label 512, and locations outside the tip (e.g., the vacuum region) are shown to the right of label 512. Note that this figure is not to scale, is distorted, and some aspects are exaggerated in order to more clearly illustrate key aspects of the electron source. Dashed line 502 represents the Fermi level within the field emitter near its tip under conditions where only a small current is flowing through the tip. Line 503 represents the top of the valence band within the semiconductor. Line 504 represents the bottom of the conduction band. The difference between the bottom of the conduction band and the top of the valence band is called the band gap. For silicon, the band gap is approximately 1.1 eV, but is reduced where the dopant concentration is high. Dot-dashed line 505 represents the vacuum energy level. Dashed line 506 in the vacuum region represents the potential distribution just outside of the tip of the field emitter caused by a relative positive potential applied to an anode (not shown) located at a distance, such as a distance greater than about 1 μm from the tip.

The tip of the field emitter cathode can be heavily p doped from explicit doping, from diffusion of boron from a surface boron coating (not shown because it is only a few nm thick), or from a combination of the two. Because of the heavy p-type doping near the surface, without an externally applied electric field from the anode the Fermi level would be just above the top of the valence band causing the bands to bend up close to the surface. However, the applied electric field from the anode will penetrate into the silicon causing the conduction and valence bands to bend down towards the tip as indicated by arrow 522.

Field emission from silicon field emitters can be described by the Fowler-Nordheim tunneling. The local field at the emitter tips is enhanced by a field enhancement factor compared with the applied electric field. As the external electric field penetrates into the semiconductor, the carrier concentration in the near-surface region changes, and both the conduction band 504 and valence band 503 bend at the emitter surface as indicated by arrow 522.

If the conduction band is bent sufficiently to bring the bottom of the conduction band 504 below the Fermi level 502, electrons collect in the dip as depicted at 523. The highest filled level of the collection coincides with the Fermi level 502, which remains approximately constant throughout the semiconductor when no current or only a small current is flowing. The large external field accelerates electrons as they move toward the field emitter cathode surface 512 and allows them to reach surface 512 with enough energy to have a high probability of escaping as illustrated by the arrow 520.

For a high electrostatic bias field such as $10^7$ V cm$^{-1}$, the conduction band of p-type field emitter will be degenerate at the surface, and a depletion region, in which the Fermi level 502 lies in the middle of the energy gap, is created between the p-type interior and the n-type surface. This leads to a minimum concentration of electrons and holes in such region, similar to the case of a reverse-biased p-n junction.

When the cathode comprises n-type silicon, or when a cathode comprising p-type silicon is operated as a photocathode, the applied electrostatic field need only be strong enough to bend the conduction and valence bands down at the tip, and does not need to bend the conduction band below the Fermi level. With such an applied electrostatic field, few electrons will be generated spontaneously and most of the emission current will come from electrons injected into the region near the tip from an n-type silicon substrate or from electron-hole pairs created by absorption of light.

In previous silicon field emitters, there would be an oxide layer on the silicon surface. This oxide, even if only about 2 nm thick, can represent a substantial barrier to any electrons trying to escape. The band gap of silicon dioxide is approximately 9 eV. Such a large band gap results in a local peak in the conduction band within the oxide that is several eVs higher than the conduction band within the silicon. The boron layer on the disclosed emitter cathode surface blocks oxygen or water from reaching the silicon surface and prevents growth of an oxide layer, thus enabling an efficient electron source. In an embodiment, this silicon field emitter is operated at a temperature close to room temperature to minimize the energy spread of the emitted electrons. In another embodiment, which may be useful when a larger energy spread can be tolerated, the silicon field emitter is operated at an elevated temperature, such as a temperature between about 400 K and about 1000 K, in order to reduce contamination adhering to the surface of the field emitter and allow operation of the silicon field emitter in a less clean vacuum environment.

Figure 6:
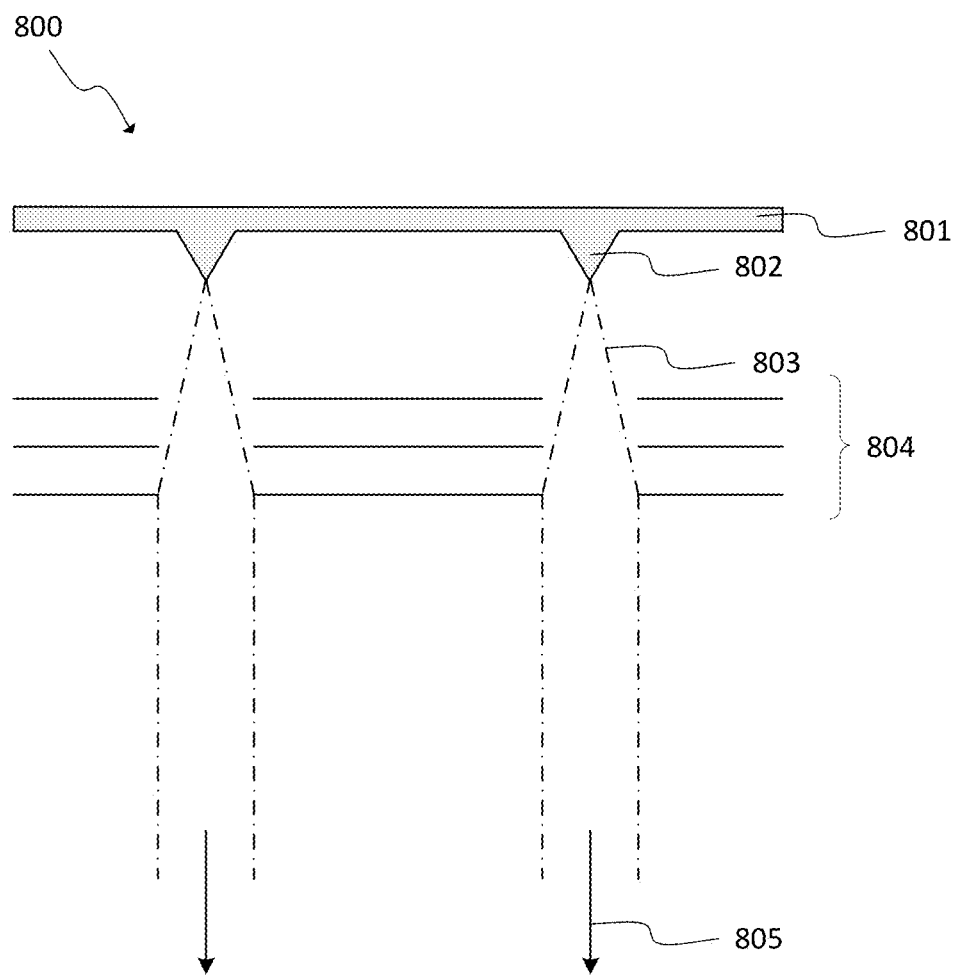
FIG. 6 is a cross-sectional side view illustrating an electron source having a plurality of sources of electron beams.

FIG. 6 is a cross-sectional side view illustrating an electron source 800 configured to generate a plurality of electron beams 803. An electron source cathode 801 is shown having a plurality of field emitters 802 that are arranged in an array. The plurality of field emitters 802 generate a plurality of electron beams 803, traveling through the extraction and focusing electrodes 804. The collimated electron beams are directed downward as indicated by arrows 805.

Figure 7:
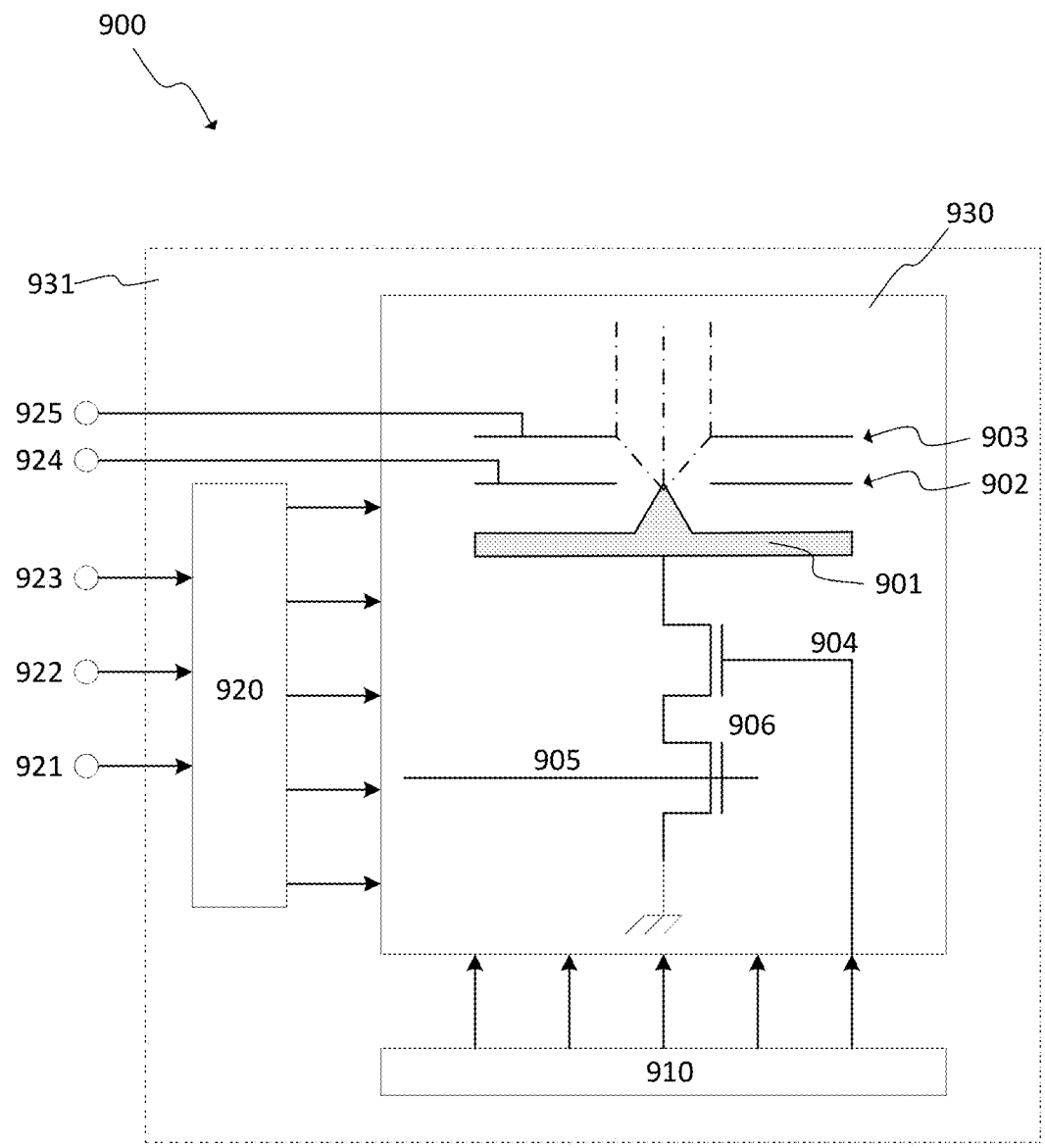
FIG. 7 shows a schematic diagram of a field emitter array integrated with driving circuits.
Figure 8:
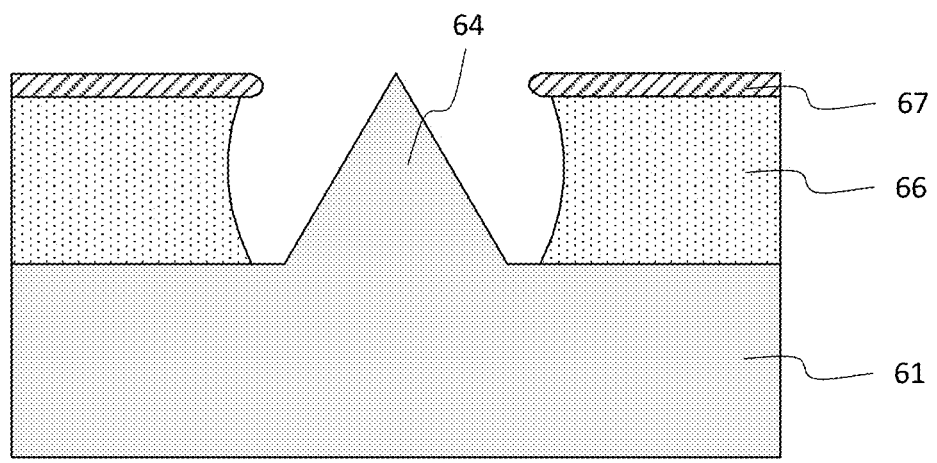
FIG. 8 is a cross-sectional side view illustrating a typical electron source comprising a silicon field emitter.

FIG. 7 shows a schematic diagram of the present field emitter array integrated with driving circuits. FETs can be used to simultaneously and/or individually control the field emitters, for example to control beam placement, footprint, dose (emission current) and/or blur. An array of boron-coated silicon field emitters with associated controlling circuits 930 (note that only one emitter is drawn in order to show the electrical connections and inputs in details) is integrated on a single chip 931. The array comprises boron-coated silicon field emitters 901, extraction electrodes 902 with connections 924 and focusing electrodes 903 with connections 925, emission control metal-oxide-semiconductor field-effect transistors (MOSFETs) 906, and driving circuits comprising DC power 921, clock 922, and reset 923 may be integrated on a single chip 931. The outputs of the driving circuits, consisting of a scan driver or a shift register 920, are connected to the gate electrodes of the emission-control MOSFETs 906. Each emitter of field emitter array 901 is connected to two emission-control MOSFETs 906 in series. One is for a data input line 910 and the other is for a scan line 905. The focusing electrode 903 not only focuses the electron beams emitted from the field emitters but also avoids the charging of the insulating layer by ion impinging in the poor vacuum. The charges on the insulator may form an inversion layer in the underlying silicon, which may affect the emission control. In one embodiment, some of the circuits, such as part, or all, of scan driver or shift register 920 are located externally to the single chip. In another embodiment, one, or more, of electrodes 902 and 903 are located externally to the chip rather than being integrated on the surface.

Various modifications to the described embodiments will be apparent to those with skill in the art, and the general principles defined herein may be applied to other embodiments. For example, additional electrodes may be placed close to the electron emitter to control the emission, and/or to focus and direct the emitted electrons in a specific direction. Although it is expected that that the silicon field emitters disclosed herein will be particularly useful in various kinds of scanning electron microscopes and electron beam lithography systems, it is also envisioned that these emitters may be useful in other applications where high radiance and/or high current electron emitters are required, for example in a high-brightness X-ray generator.

Therefore, the electron emitters and methods described herein are not intended to be limited to the particular embodiments shown and described, but are to be accorded the widest scope consistent with the principles and novel features herein disclosed.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron beam lithography system comprising:
   a plurality of columns, each of the columns having electron optics, wherein the electron optics are configured to de-magnify and focus an electron beam onto a sample;
   an electron source configured to generate at least two of the electron beams that are directed toward the sample, wherein the electron source includes:
   a silicon substrate having a top surface;
   at least two field emitters formed directly on the top surface of the silicon substrate, wherein each field emitter comprises a pyramid, a rounded cone, or a rounded whisker, wherein each of the field emitters on the silicon substrate is aligned with one of the columns whereby the field emitters are each configured to emit one of the electron beams into one of the columns; and
   a boron layer disposed on each field emitter, wherein the boron layer is greater than 90% boron;
   a stage configured to hold the sample, wherein the electron beam lithography system is configured to write a pattern on the sample with the at least two electron beams;
   an immersion lens for each of the columns configured to focus the primary electron beam on the sample; and
   a backscattered electron detector configured to detect backscattered electrons from a surface of the sample.

2. The electron beam lithography system of claim 1, wherein two of the field emitters are spaced apart on the silicon substrate from 10 µm to 500 µm.

3. The electron beam lithography system of claim 1, wherein at least four of the field emitters are formed directly on the top surface of the silicon substrate, and wherein the at least four of the field emitters are disposed on the top surface of the silicon substrate in a regular grid pattern.

4. The electron beam lithography system of claim 1, wherein the electron source in each of the columns further includes:
   a plurality of extraction and focusing electrodes configured to extract and focus the primary electron beam in the column;
   a plurality of apertures; and
   alignment deflectors.

5. The electron beam lithography system of claim 1, wherein the electron optics in each of the columns further includes:
   a rotator;
   accelerating column plates configured to increase energy of the primary electron beam in the column; and
   mainfield and subfield deflectors.

6. The electron beam lithography system of claim 1, wherein each of the columns further comprises a blanking system that includes a blanking electrode and a blanking aperture.

7. The electron beam lithography system of claim 1, wherein the electron beam is configured to have an energy from 1 keV to 5 keV.

8. The electron beam lithography system of claim 1, wherein each of the two field emitters is configured in a diode or triode configuration.

9. The electron beam lithography system of claim 1, wherein the field emitters are connected to a driving circuit and two emission-control MOSFETs in series, wherein the two emission-control MOSFETs include a data input line and a scan line.

10. The electron beam lithography system of claim 1, wherein the at least two field emitters are p-type doped with a doping level less than about $10^{19}$ cm$^{-3}$.

11. The electron beam lithography system of claim 10, wherein the at least two field emitters are configured to operate in a reverse bias mode in which a depletion layer is generated by an electric field at the emitter surface.

12. The electron beam lithography system of claim 1, wherein the at least two field emitters are p-type doped with a doping level less than about $10^{14}$ cm$^{-3}$.

13. The electron beam lithography system of claim 12, wherein the at least two field emitters are configured to operate in a reverse bias mode in which a depletion layer is generated by an electric field at the emitter surface.

14. The electron beam lithography system of claim 12, wherein the electron source further comprises light sources configured to illuminate the at least two field emitters and to control the emission currents from the at least two field emitters.

15. The electron beam lithography system of claim 1, wherein the at least two field emitters are n-type doped with a doping level greater than about $10^{16}$ cm$^{-3}$.

16. The electron beam lithography system of claim 1, wherein the boron layer has a thickness in the range of approximately 2 nm to 6 nm.

17. The electron beam lithography system of claim 1, wherein the electron source further comprises:
   a dielectric layer disposed on the top surface of the silicon adjacent to the field emitter; and
   a conductive gate disposed on top of the dielectric layer, wherein a thickness of the dielectric layer is approximately equal to or less than a height of the field emitter.

18. The electron beam lithography system of claim 1, wherein the electron source further comprises field-effect transistors (FETs) configured to control the emission current.

19. The electron beam lithography system of claim 18, wherein the electron source further comprises:
   a second dielectric layer disposed on the top surface of a conductive gate; and
   a focusing electrode disposed on top of the second dielectric layer.

20. The electron beam lithography system of claim 1, wherein tips of the at least two field emitters each have a lateral dimension greater than 10 nm and less than 100 nm.

* * * * *